United States Patent
Herchen

(10) Patent No.: US 8,785,821 B2
(45) Date of Patent: Jul. 22, 2014

(54) SUBSTRATE PROCESSING APPARATUS WITH HEATER ELEMENT HELD BY VACUUM

(75) Inventor: Harald Herchen, Los Altos, CA (US)

(73) Assignee: Sokudo Co., Ltd., Kyoto (JP)

( * ) Notice: Subject to any disclaimer, the term of this patent is extended or adjusted under 35 U.S.C. 154(b) by 943 days.

(21) Appl. No.: 12/823,802

(22) Filed: Jun. 25, 2010

(65) Prior Publication Data

US 2011/0000426 A1 Jan. 6, 2011

Related U.S. Application Data

(60) Provisional application No. 61/223,335, filed on Jul. 6, 2009.

(51) Int. Cl.
*H05B 3/68* (2006.01)
*C23C 16/00* (2006.01)

(52) U.S. Cl.
USPC ........................................ 219/444.1; 118/724

(58) Field of Classification Search
USPC .............. 219/443.1, 444.1, 546–548; 118/50, 118/50.1, 724, 725
See application file for complete search history.

(56) References Cited

U.S. PATENT DOCUMENTS

| | | | |
|---|---|---|---|
| 5,034,688 A * | 7/1991 | Moulene et al. | 324/750.03 |
| 6,353,209 B1 * | 3/2002 | Schaper et al. | 219/444.1 |
| 6,639,189 B2 * | 10/2003 | Ramanan et al. | 219/444.1 |
| 6,815,646 B2 * | 11/2004 | Ito et al. | 219/444.1 |
| 6,878,907 B2 * | 4/2005 | Hiramatsu et al. | 219/444.1 |
| 7,432,476 B2 | 10/2008 | Morita et al. | |
| 2007/0222131 A1 | 9/2007 | Fukumoto et al. | |

* cited by examiner

*Primary Examiner* — Sang Y Paik
(74) *Attorney, Agent, or Firm* — Kilpatrick Townsend & Stockton LLP

(57) ABSTRACT

A substrate processing apparatus for heating a substrate is provided. The substrate processing apparatus can include a top and bottom planar member. A heater layer can be disposed between the top and the bottom planar member and held in place by evacuating a region between the two planar members. The heater layer can be made of alternating insulating and conducting layers with heater elements formed on the conducting layers in predetermined pattern.

6 Claims, 4 Drawing Sheets

SUBSTRATE PROCESSING APPARATUS WITH HEATER ELEMENT HELD BY VACUUM

CROSS-REFERENCES TO RELATED APPLICATIONS

The present application claims benefit under 35 U.S.C. §119(e) of U.S. Provisional Patent Application No. 61/223,335, filed Jul. 6, 2009, which is hereby incorporated by reference in its entirety.

BACKGROUND OF THE INVENTION

The present invention relates generally to the field of substrate processing equipment. More particularly, the present invention relates to a system and apparatus for controlling the temperature of substrates, such as semiconductor wafers, used in the formation of integrated circuits.

Modern integrated circuits contain millions of individual elements that are formed by patterning the materials, such as silicon, metal and/or dielectric layers, that make up the integrated circuit to sizes that are small fractions of a micrometer. The technique used throughout the industry for forming such patterns is photolithography. A typical photolithography process sequence generally includes depositing one or more uniform photoresist (resist) layers on the surface of a substrate, drying and curing the deposited layers, patterning the substrate by exposing the photoresist layer to electromagnetic radiation that is suitable for modifying the exposed layer and then developing the patterned photoresist layer.

It is common in the semiconductor industry for many of the steps associated with the photolithography process to be performed in a multi-chamber processing system (e.g., a cluster tool) that has the capability to sequentially process semiconductor wafers in a controlled manner. One example of a cluster tool that is used to deposit (i.e., coat) and develop a photoresist material is commonly referred to as a track lithography tool.

Track lithography tools typically include a mainframe that houses multiple chambers (which are sometimes referred to herein as stations) dedicated to performing the various tasks associated with pre- and post-lithography processing. There are typically both wet and dry processing chambers within track lithography tools. Wet chambers include coat and/or develop bowls, while dry chambers include thermal control units that house bake and/or chill plates. Track lithography tools also frequently include one or more pod/cassette mounting devices, such as an industry standard FOUP (front opening unified pod), to receive substrates from and return substrates to the clean room, multiple substrate transfer robots to transfer substrates between the various chambers/stations of the track tool and an interface that allows the tool to be operatively coupled to a lithography exposure tool in order to transfer substrates into the exposure tool and receive substrates from the exposure tool after the substrates are processed within the exposure tool.

Over the years, there has been a strong push within the semiconductor industry to shrink the size of semiconductor devices. The reduced feature sizes have caused the industry's tolerance to process variability to shrink, which in turn, has resulted in semiconductor manufacturing specifications having more stringent requirements for process uniformity and repeatability. An important factor in minimizing process variability during track lithography processing sequences is to ensure that every substrate processed within the track lithography tool for a particular application has the same "wafer history." A substrate's wafer history is generally monitored and controlled by process engineers to ensure that all of the device fabrication processing variables that may later affect a device's performance are controlled, so that all substrates in the same batch are always processed the same way.

To ensure that each substrate has the same "wafer history" requires that each substrate experiences the same repeatable substrate processing steps (e.g., consistent coating process, consistent hard bake process, consistent chill process, etc.) and the timing between the various processing steps is the same for each substrate. Lithography type device fabrication processes can be especially sensitive to variations in process recipe variables, e.g., temperature and the timing between the recipe steps, which directly affects process variability and ultimately device performance.

Despite the advances made in performing semiconductor processing operations, there is a need in the art for improved methods and systems for thermal processing of semiconductor substrates.

SUMMARY OF THE INVENTION

Certain embodiments of the present invention provide a substrate processing apparatus. The substrate processing apparatus may include a first planar member, a second planar member disposed below the first planar member, and an evacuated region between the first planar member and the second planar member. The substrate processing apparatus may further include a heating layer disposed in the evacuated region. In one embodiment, the heating layer is coupled to a lower surface of the first planar member and an upper surface of the second planar member and is held in place by the low pressure/vacuum present in the evacuated region.

Other embodiments of the present invention provide a heater assembly. The heater assembly may include a first insulating layer and a first conducting layer disposed on and coupled to the first insulating layer. The heater assembly may further include a second insulating layer disposed on and coupled to the first conducting layer and a second conducting layer disposed on and coupled to the second insulating layer. Heater assembly may also include a third insulating layer disposed on and coupled to the second conducting layer. The conducting layers may have heater elements arranged in a predetermined pattern.

In still other embodiments, a dual stack heater is provided. Each stack can include a conducting layer disposed between two insulating layers. The conducting layer in one stack may have heater elements arranged in multiple independent zones while the conducting layer in the other stack may have heater elements arranged to form a single heating zone.

The following detailed description, together with the accompanying drawings will provide a better understanding of the nature and advantages of the present invention.

DETAILED DESCRIPTION OF SPECIFIC EMBODIMENTS

Conventional techniques for manufacturing heating apparatus include bonding, screwing, or screen-printing heater elements onto metal or ceramic plates. There are several disadvantages to these methods. First, the coefficient of thermal expansion (CTE) of the material of the metal plate may be different from the CTE of materials used to manufacture the heater elements. Due to this mismatch in the CTE, different parts of the heating apparatus can expand/contract at different rates causing bending/warping of the heating apparatus. Second, bonding and other similar techniques permanently connect the heater elements to the metal/ceramic plates. Therefore, changing the heater elements in case of malfunction involves replacing the entire heating apparatus. This can dramatically increase maintenance costs resulting in higher Cost of Ownership (CoO) for the customer. Finally, it is nearly impossible to change the heater configuration once the heater elements are bonded to the metal plates. Therefore, in an instance where a heating configuration change is desired, the only alternative available is to manufacture an entirely new assembly.

Certain embodiments of the present invention eliminate the problems with conventional designs by providing a heater coupled to plates made of high thermal conductivity material. The heater is coupled to the plates by e.g., using vacuum pressure. This enables easy change of the heater element in case of failure or heating configuration change without the need for replacing the entire heating apparatus.

Figure 1:
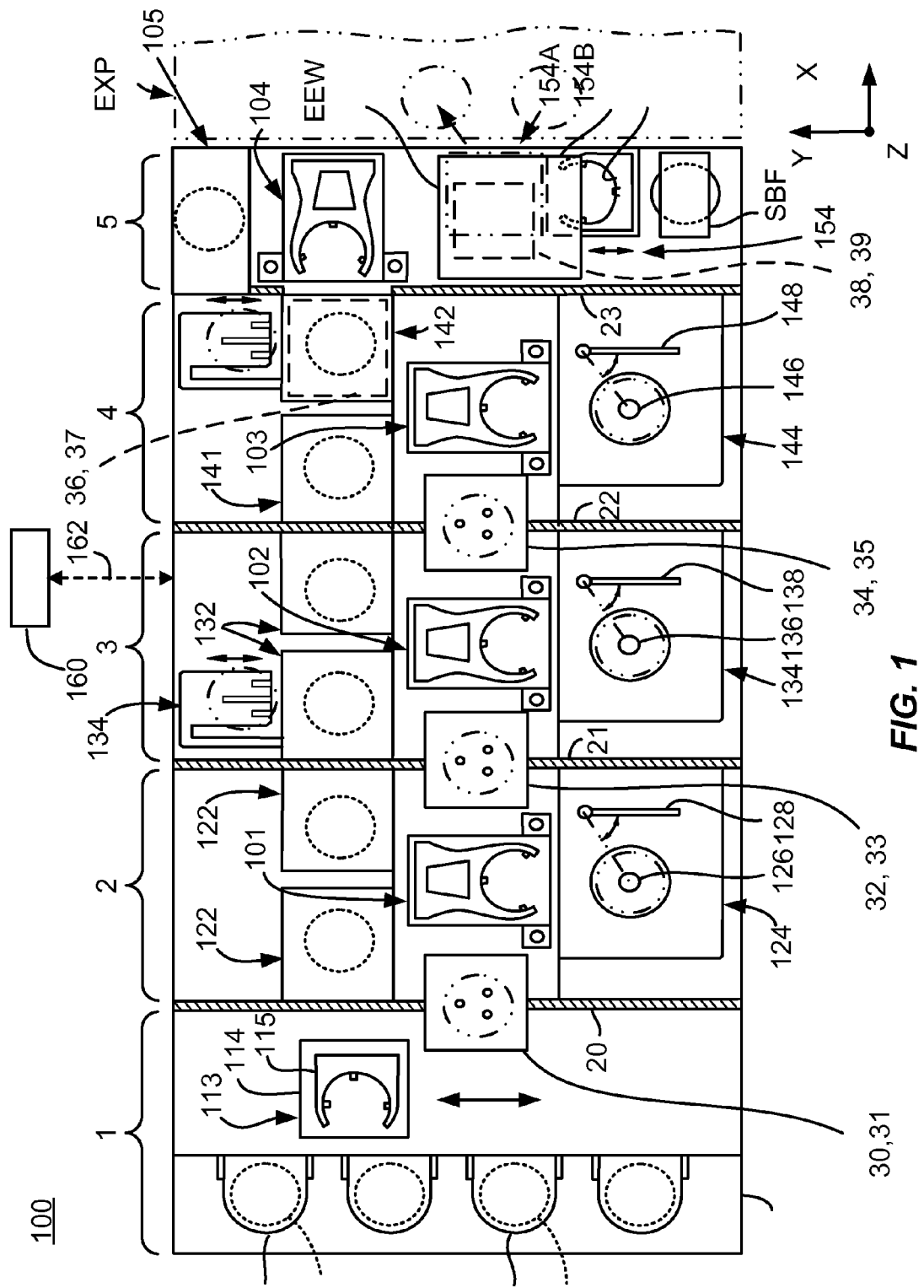
FIG. 1 is a simplified schematic diagram of a track lithography tool in which embodiments of the present invention may be implemented.

FIG. 1 is a plan view of a track lithography tool according to an embodiment of the present invention. In the embodiment illustrated in FIG. 1, the track lithography tool is coupled to an immersion scanner. An XYZ rectangular coordinate system in which an XY plane is defined as the horizontal plane and a Z-axis is defined to extend in the vertical direction is additionally shown in FIG. 1 for purposes of clarifying the directional relationship therebetween.

In a particular embodiment, the track lithography tool is used to form, through use of a coating process, an anti-reflection (AR) and a photoresist film on substrates, for example, semiconductor substrates. The track lithography tool is also used to perform a development process on the substrates after they have been subjected to a pattern exposure process. The substrates processed by the track lithography tool are not limited to semiconductor substrates, but may include glass substrates for a liquid crystal display device, and the like.

The track lithography tool 100 illustrated in FIG. 1 includes an factory interface block 1, a BARC (Bottom Anti-Reflection Coating) block 2, a resist coating block 3, a development processing block 4, and a scanner interface block 5. In the track lithography tool, the five processing blocks 1 to 5 are arranged in a side-by-side relation. An exposure unit (or stepper) EXP, which is an external apparatus separate from the track lithography tool is provided and coupled to the scanner interface block 5. Additionally, the track lithography tool and the exposure unit EXP are connected via LAN lines 162 to a host computer 160.

The factory interface block 1 is a processing block for transferring unprocessed substrates received from outside of the track lithography tool to the BARC block 2 and the resist coating block 3. The factory interface block 1 is also useful for transporting processed substrates received from the development processing block 4 to the outside of the track lithography tool. The factory interface block 1 includes a table 112 configured to receive a number of (in the illustrated embodiment, four) cassettes (or carriers) C, and a substrate transfer mechanism 113 for retrieving an unprocessed substrate W from each of the cassettes C and for storing a processed substrate W in each of the cassettes C. The substrate transfer mechanism 113 includes a movable base 114, which is movable in the Y direction (horizontally) along the table 112, and a robot arm 115 mounted on the movable base 114.

The robot arm 115 is configured to support a substrate W in a horizontal position during substrate transfer operations. Additionally, the robot arm 115 is capable of moving in the Z direction (vertically) in relation to the movable base 114, pivoting within a horizontal plane, and translating back and forth in the direction of the pivot radius. Thus, using the substrate transfer mechanism 113, the holding arm 115 is able to gain access to each of the cassettes C, retrieve an unprocessed substrate W out of each cassette C, and store a processed substrate W in each cassette C. The cassettes C may be one or several types including: an SMIF (standard mechanical interface) pod; an OC (open cassette), which exposes stored substrates W to the atmosphere; or a FOUP (front opening unified pod), which stores substrates W in an enclosed or sealed space.

The BARC block 2 is positioned adjacent to the factory interface block 1. Partition 20 may be used to provide an atmospheric seal between the factory interface block 1 and the BARC block 2. The partition 20 is provided with a pair of vertically arranged substrate rest parts 30 and 31 each used as a transfer position when transferring a substrate W between the factory interface block 1 and the BARC block 2.

The upper substrate rest part 30 is used for the transport of a substrate W from the factory interface block 1 to the BARC block 2. The substrate rest part 30 includes three support pins. The substrate transfer mechanism 113 of the factory interface block 1 places an unprocessed substrate W, which was taken out of one of the cassettes C, onto the three support pins of the substrate rest part 30. A transport robot 101 in the BARC block 2 (described more fully below) is configured to receive the substrate W placed on the substrate rest part 30. The lower substrate rest part 31, on the other hand, is used for the transport of a substrate W from the BARC block 2 to the factory interface block 1. The substrate rest part 31 also includes three support pins. The transport robot 101 in the BARC block 2 places a processed substrate W onto the three support pins of the substrate rest part 31. The substrate transfer mechanism 113 is configured to receive the substrate W placed on the substrate rest part 31 and then store the substrate W in one of the cassettes C. Pairs of substrate rest parts 32-39 (which are described more fully below) are similar in construction and operate in an analogous manner to the pair of substrate rest parts 30 and 31.

The substrate rest parts 30 and 31 extend through the partition 20. Each of the substrate rest parts 30 and 31 include an optical sensor (not shown) for detecting the presence or absence of a substrate W thereon. Based on a detection signal from each of the sensors, control of the substrate transfer mechanism 113 and the transport robot 101 of the BARC block 2 is exercised to transfer and receive a substrate W to and from the substrate rest parts 30 and 31.

Referring to FIG. 1 again, BARC block 2 is also included in the track lithography tool 100. The BARC block 2 is a processing block for forming an AR film (also referred to as a BARC) on a substrate using a coating process. The BARC is positioned in the film stack under the photoresist film, which is subsequently deposited. The BARC reduces standing waves or halation occurring during exposure. The BARC block 2 includes a bottom coating processor 124 configured to coat the surface of a substrate W with the AR film, a pair of thermal processing towers 122 for performing one or more thermal processes that accompany the formation of the AR film, and the transport robot 101, which is used in transferring and receiving a substrate W to and from the bottom coating processor 124 and the pair of thermal processing towers 122.

In the BARC block 2, the bottom coating processor 124 and the pair of thermal processing towers 122 are arranged on opposite sides of the transport robot 101. Specifically, the bottom coating processor 124 is on the front side of the track lithography tool and the pair of thermal processing towers 122 are on the rear side thereof. Additionally, a thermal barrier (not shown) is provided on the front side of the pair of thermal processing towers 122. Thus, the thermal crosstalk from the pair of thermal processing towers 122 to the bottom coating processor 124 is reduced by the spacing between the bottom coating processor 124 and the pair of thermal processing towers 122 and through the use of the thermal barrier.

Generally, the bottom coating processor 124 includes three vertically stacked coating processing units that are similar in construction. The three coating processing units are collectively referred to as the bottom coating processor 124, unless otherwise identified. Each of the coating processing units includes a spin chuck 126 on which the substrate W is rotated in a substantially horizontal plane while the substrate W is held in a substantially horizontal position through suction. Each coating processing unit also includes a coating nozzle 128 used to apply a coating solution for the AR film onto the substrate W held on the spin chuck 126, a spin motor (not shown) configured to rotatably drive the spin chuck 126, a cup (not shown) surrounding the substrate W held on the spin chuck 22, and the like.

The thermal processing towers 122 include a number of bake plates used to heat a substrate W to a predetermined temperature and a number of cool plates used to cool a heated substrate down to a predetermined temperature and thereafter maintain the substrate at the predetermined temperature. The bake plates and cool plates are vertically stacked, with the cool plates generally mounted underneath the bake plates. The thermal processing towers may also include a number of vertically stacked adhesion promotion units (e.g., HMDS treatment units). Vertical stacking of processing units reduces the tool footprint and reduces the amount of ancillary equipment (e.g., temperature and humidity control apparatus, electrical service, and the like).

Referring once again to FIG. 1, the resist coating block 3 is a processing block for forming a resist film on the substrate W after formation of the AR film in the BARC block 2. In a particular embodiment, a chemically amplified resist is used as the photoresist. The resist coating block 3 includes a resist coating processor 134 used to form the resist film on top of the AR film, a pair of thermal processing towers 132 for performing one or more thermal processes accompanying the resist coating process, and the transport robot 102, which is used to transfer and receive a substrate W to and from the resist coating processor 134 and the pair of thermal processing towers 132.

Similar to the configuration of the processors in BARC block 2, the resist coating processor 134 and the pair of thermal processing towers 132 are arranged on opposite sides of the transport robot 102. A thermal barrier (not shown) is provided to reduce thermal crosstalk between processors. Generally, the resist coating processor 134 includes three vertically stacked coating processing units that are similar in construction. Each of the coating processing units includes a spin chuck 136, a coating nozzle 138 for applying a resist coating to the substrate W, a spin motor (not shown), a cup (not shown), and the like.

The thermal processing towers 132 include a number of vertically stacked bake chambers and cool plates. In a particular embodiment, the thermal processing tower closest to the factory interface block 1 includes bake chambers and the thermal processing tower farthest from the factory interface block 1 includes cool plates. In the embodiment illustrated in FIG. 1, the bake chambers include a vertically stacked bake plate and temporary substrate holder as well as a local transport mechanism 134 configured to move vertically and horizontally to transport a substrate W between the bake plate and the temporary substrate holder and may include an actively chilled transport arm. The transport robot 102 is identical in construction to the transport robot 101 in some embodiments. The transport robot 102 is able to independently access substrate rest parts 32 and 33, the thermal processing towers 132, the coating processing units provided in the resist coating processor 134, and the substrate rest parts 34 and 35.

The development processing block 4 is positioned between the resist coating block 3 and the scanner interface block 5. A partition 22 for sealing the development processing block from the atmosphere of the resist coating block 3 is provided. The upper substrate rest part 34 is used to transport a substrate W from the resist coating block 3 to the development processing block 4. The lower substrate rest part 35, on the other hand, is used to transport a substrate W from the development processing block 4 to the resist coating block 3. As described above, substrate rest parts 32-39 may include an optical sensor for detecting the presence or absence of a substrate W thereon. Based on a detection signal from each of the sensors, control of the various substrate transfer mechanisms and transport robots of the various processing blocks is exercised during substrate transfer processes.

The development processing block 4 includes a development processor 144 for applying a developing solution to a substrate W after exposure in the scanner EXP, a pair of thermal processing towers 141 and 142, and transport robot 103. The development processor 144 includes five vertically stacked development processing units that are similar in construction to each other. Each of the development processing units includes a spin chuck 146, a nozzle 148 for applying developer to a substrate W, a spin motor (not shown), a cup (not shown), and the like.

Thermal processing tower 142 includes bake chambers and cool plates as described above. Additionally, thermal processing tower 142 is accessible to both transport robot 103 as well as transport robot 104. Thermal processing unit 141 is accessible to transport robot 103. Additionally, thermal processing tower 142 includes substrate rest parts 36 and 37, which are used when transferring substrates to and from the development processing block 4 and the scanner interface block 5.

The interface block 5 is used to transfer a coated substrate W to the scanner EXP and to transfer an exposed substrate to the development processing block 5. The interface block 5 in this illustrated embodiment includes a transport mechanism 154 for transferring and receiving a substrate W to and from the exposure unit EXP, a pair of edge exposure units EEW for exposing the periphery of a coated substrate, a curing module 105 and transport robot 104. The curing module 105 can be configured to expose the wafer to incident radiation and is separate from the exposure module EXP described below. Typically, the curing module is configured to allow the substrate to be exposed to ultra-violet radiation, but can also be configured with other types of radiation sources. Substrate rest parts 38 and 39 are provided along with the pair of edge exposure units EEW for transferring substrates to and from the scanner and the development processing unit 4.

The exposure unit EXP is configured to allow the substrate to be exposed to incident radiation of various wavelengths. The exposure unit EXP usually consists of an illumination source that generates the radiation. The typical illumination sources used in an exposure unit are gas discharge lamps using either Krypton Fluoride (KrF), Argon Fluoride (ArF), or other suitable lamps. These particular lamps generate radiation with wavelengths of 248 nm and 193 nm, respectively.

The transport mechanism 154 includes a movable base 154A and a holding arm 154B mounted on the movable base 154A. The holding arm 154B is capable of moving vertically, pivoting, and moving back and forth in the direction of the pivot radius relative to the movable base 154A. The send buffer SBF is provided to temporarily store a substrate W prior to the exposure process if the exposure unit EXP is unable to accept the substrate W, and includes a cabinet capable of storing a plurality of substrates W in tiers.

Controller 160 is used to control all of the components and processes performed in the cluster tool. The controller 160 is generally adapted to communicate with the scanner EXP, monitor and control aspects of the processes performed in the cluster tool, and is adapted to control all aspects of the complete substrate processing sequence. The controller 160, which is typically a microprocessor-based controller, is configured to receive inputs from a user and/or various sensors in one of the processing chambers and appropriately control the processing chamber components in accordance with the various inputs and software instructions retained in the controller's memory. The controller 160 generally contains memory and a CPU (not shown) which are utilized by the controller to retain various programs, process the programs, and execute the programs when necessary. The memory (not shown) is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits (not shown) are also connected to the CPU for supporting the processor in a conventional manner. The support circuits may include cache, power supplies, clock circuits, input/output circuitry, subsystems, and the like all well known in the art. A program (or computer instructions) readable by the controller 160 determines which tasks are performable in the processing chambers. Preferably, the program is software readable by the controller 160 and includes instructions to monitor and control the process based on defined rules and input data.

Although embodiments of the present invention are described herein in the context of the track lithography tool illustrated in FIG. 1, other architectures for track lithography tools are included within the scope of embodiments of the present invention. For example, track lithography tools utilizing Cartesian architectures are suitable for use with embodiments as described throughout the present specification. In a particular embodiment, implementation is performed for an $RF^3i$, available from Sokudo Co., Ltd. of Kyoto, Japan.

The challenges to high-resolution lithography are encapsulated in the resolution equation: $CD=k1*l/NA$, where CD is the smallest attainable critical dimension, k1 is a measure of process difficulty, I is the illumination wavelength, and NA is the effective numerical aperture of the optical system. Some resolution enhancement techniques involve methods that reduce k1 at a given I and NA and therefore reduce the minimum CD. According to ITRS, the k1 needs to be reduced to less than 0.3 for the 45 nm node and beyond to enable the continued use of the existing lithography equipment. Moreover, very tight CD control is essential as the industry moves towards smaller feature sizes.

Figure 2:
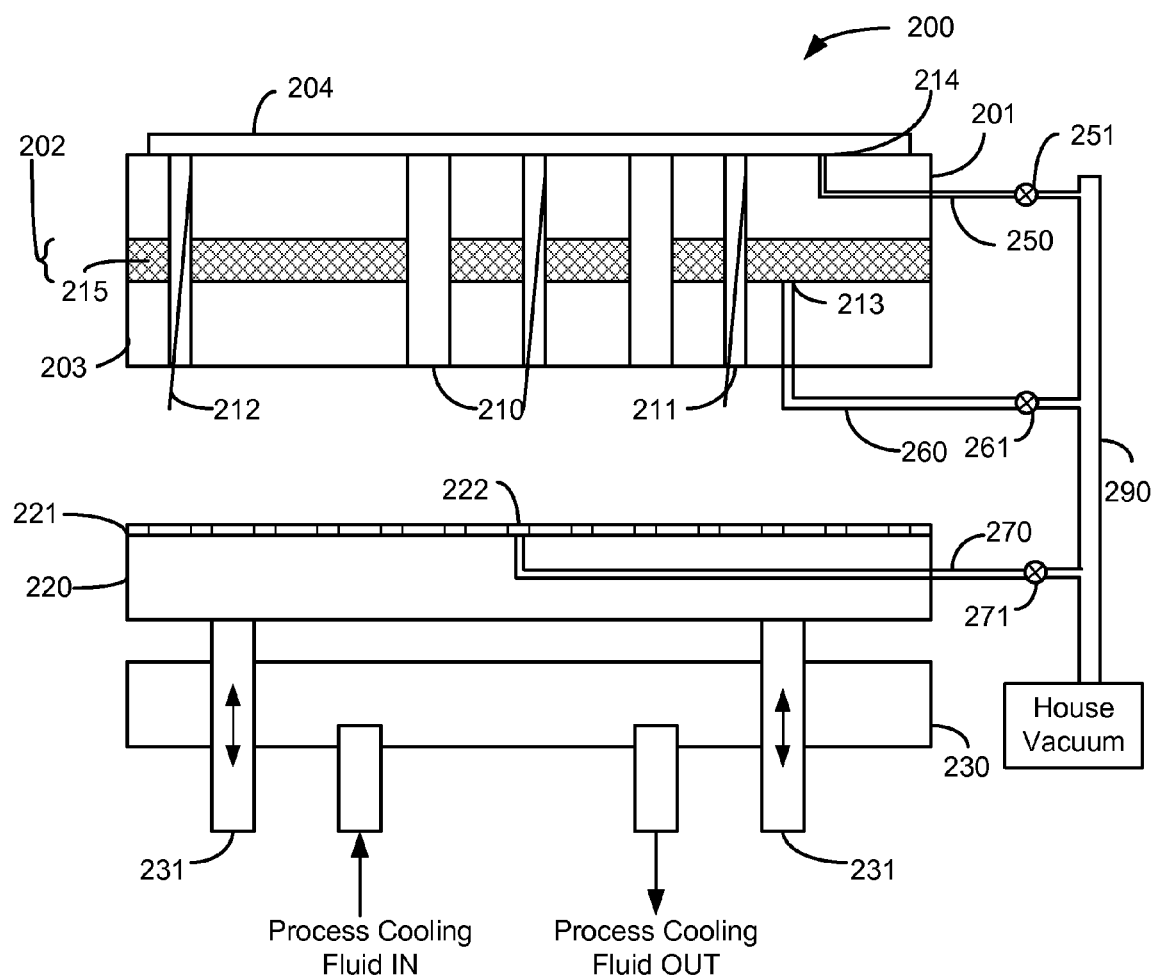
FIG. 2 is a cross-sectional view of a substrate processing apparatus according to an embodiment of the present invention.

FIG. 2 illustrates substrate processing apparatus 200. In some embodiments, the substrate processing apparatus can be a bake plate used to heat the substrate to a predetermined temperature as part of the processing sequence. The substrate processing apparatus 200 can be implemented as one of the components (e.g., a bake plate) of the thermal processing towers 122 illustrated in FIG. 1.

The substrate processing apparatus 200 may include a top planar member 201 and a bottom planar member 203. Top planar member 201 and bottom planar member 203 are separated by region 202. A substrate 204 can rest on an upper surface of top planar member 201. In one embodiment, the substrate can be a silicon wafer. In other embodiments, the substrate can be quartz, glass, gallium-arsenide wafers, etc. In some embodiments, the top and the bottom planar members can be made from the same material in order to obtain a close match in the CTE. In some embodiments, the planar members can be manufactured from materials including aluminum, copper, silicon carbide, aluminum nitride, hexagonal boron nitride, or a tungsten-copper alloy. In an embodiment, the tungsten-copper alloy may include about 90% tungsten and about 10% copper. Other percentage combinations of tungsten and copper are also possible and may depend on the application.

In an embodiment, top planar member 201 may include a plurality of proximity pins (not shown) disposed on the upper surface. The proximity pins may help to reduce the contact area of the substrate with upper surface of top planar member 201 thereby reducing the amount of backside particles that may be generated. Additionally, the proximity pins may create fluidic channels below the substrate that may aid in distributing the heat uniformly across the substrate. In some embodiments, top planar member 201 may include one or more vacuum ports 214 that may be connected to house vacuum system 290 via exhaust line 250 and regulator 251. In operation, the substrate may be held on the proximity pins by applying vacuum on the backside of the substrate using ports 214. In some embodiments, the proximity pins may be manufactured of materials including ceramic, aluminum, polyimide, or the like.

In some embodiments, region 202 may be characterized by a height of between 50 μm and 600 μm before it is evacuated. Heater layer 215 may be disposed in region 202. In an embodiment, region 202 includes a vacuum port 213 connected to house vacuum system 290 via exhaust line 260 and regulator 261. During operation, vacuum is applied to region 202, thereby evacuating region 202 and causing planar members 201 and 203 to be drawn toward each other and trapping heater layer 215 between them. Thus, the heater layer can be coupled to the upper and lower planar members by evacuating region 202. In an instance where there is loss of vacuum, heater layer 215 may rest on the upper surface of bottom planar member 203. In some embodiments, the lateral movement of heater layer 215 may be restricted by use of plurality of guide pins (not shown) positioned peripherally around the outer edge of the upper surface of the bottom planar member and outer edge of the lower surface of the top planar member.

A plurality of lift pins holes 210 may extend from a lower surface of bottom planar member 203 to the upper surface of top planar member 201. A plurality of lift pins can pass through holes 210 during load/unload operation of the substrate. In some embodiments, a plurality of sensor through holes 211 may extend from the lower surface of the bottom planar member to the upper surface of the top planar member. A plurality of temperature sensors 212 can be installed in through holes 211. In some embodiments, temperature sensors 212 can be installed such that a top portion of the sensor 212 is connected to a side of through hole 211 near an upper section of through hole 211. Temperature sensor 212 can be any one of resistance temperature detector (RTD), thermocouple, or a thermistor.

Substrate processing apparatus 200 may also include a movable top cooling plate 220 positioned below the lower planar member. Top cooling plate 220 may be configured to travel in a vertical direction using a plurality of air cylinders 231. Top cooling plate 220 can make contact with the lower surface of planar member 203 when cooling plate 220 is at its highest position. In the highest position, cooling plate 220 can draw heat away from the lower planar member. In some embodiments, cooling plate 220 may include thermal material 221 disposed on its upper surface. In one embodiment, thermal material 221 may comprise a thermal pad made of Kapton® material available from DuPont Inc. The thermal material may aid in efficient removal of heat from the lower planar member. In some embodiments, cooling plate 220 may include one or more vacuum ports 222 embedded in thermal material 221. Vacuum ports 222 may be connected to house vacuum system 290 via exhaust line 270 and regulator 271. Vacuum ports 222 provide a cooling path between the bottom layer of planar member 203 and the top layer of cooling plate 220. In some embodiments, the vacuum applied through ports 222 provides a uniform load across planar member 203 and cooling plate 220. This ensures that the height of an air gap between them is maintained at a constant level since both the planar member and the cooling plate are uniformly deformed. The constant air gap helps to effectively and rapidly remove heat from planar member 203 to reduce the time required to achieve a stable temperature. In an embodiment, the air gap is maintained at about 50 µm. It has been observed that the heat transfer rate is more a function of the air gap between the planar member and the cooling plate than the contact resistance or the bulk resistance of thermal material 221. In some embodiments, cooling plate 220 may be made from material including aluminum, copper, or tungsten-copper alloy.

Substrate processing apparatus 200 may also include a non-movable bottom cooling plate 230. Cooling plate 230 may provide active cooling capability and include one or more fluid channels adapted to accept a fluid like deionized water, Galden™, process cooling water, etc. A pair of fluid inlet/outlet may be provided to connect to a fluid supply/return. Top cooling plate 220 can make contact with bottom cooling plate 230 at a lower position. At the lower position, the bottom cooling plate may help draw the heat from the top cooling plate. In some embodiments, the top and bottom cooling plates can be used for lowering the temperature of the of the substrate processing apparatus during in the instance when rapid change in temperature is desired.

Figure 3:
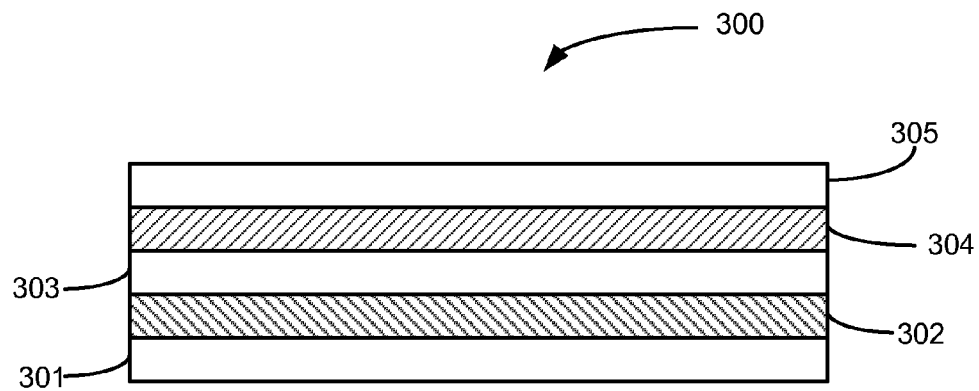
FIG. 3 is a cross-sectional view of a heater element according to an embodiment of the present invention.
Figure 5:
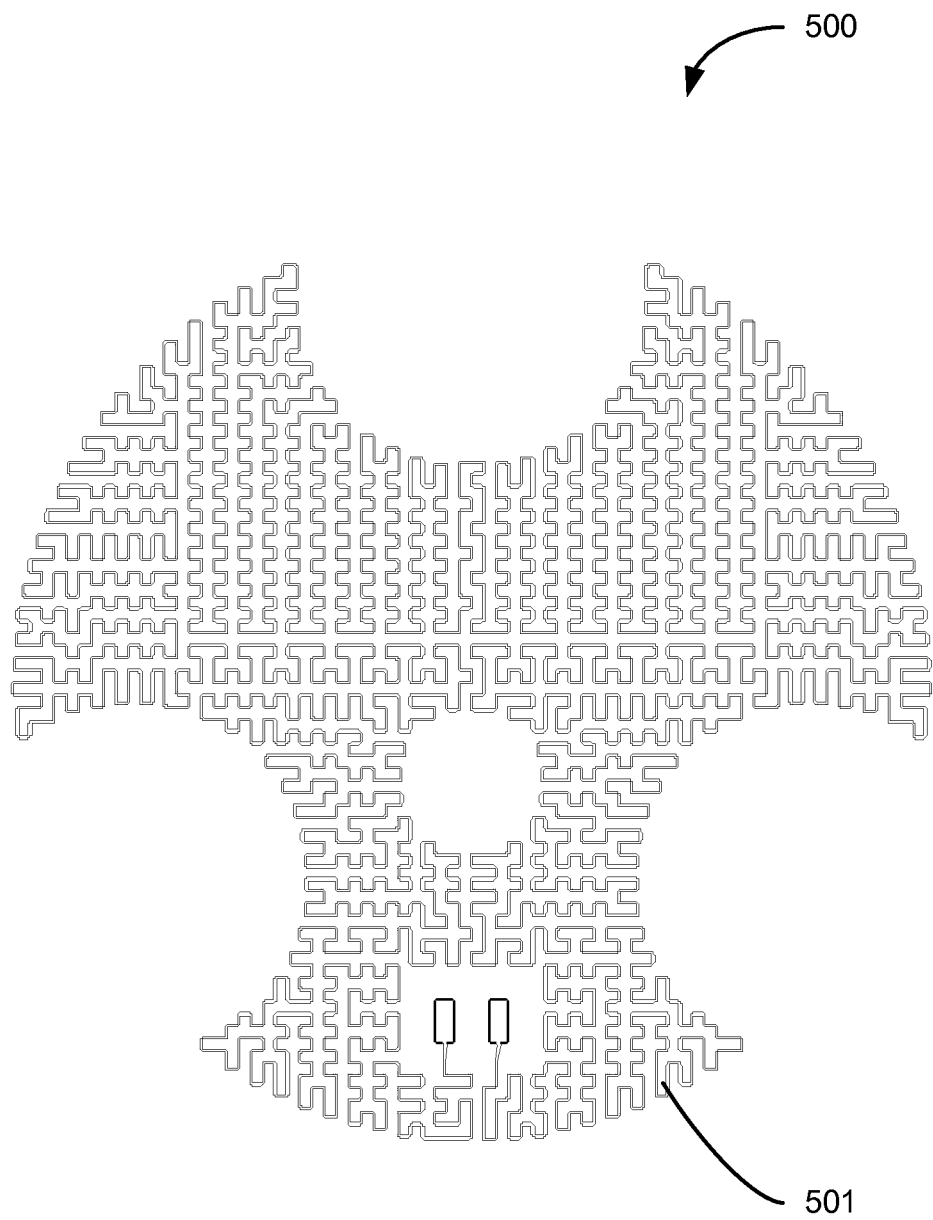
FIG. 5 illustrates a sample heater element pattern according to an embodiment of the present invention.

FIG. 3 illustrates a heater 300 according to an embodiment of the present invention. Heater element 300 can include an insulating layer 301. A conducting layer 302 is disposed over insulating layer 301. Conducting layer can be thermally coupled to insulating layer 301. In some embodiments, conducting layer 302 can include one or more heater elements arranged in a predetermined pattern. In one embodiment, the heater elements are arranged in a manner so as to provide single zone heating for the substrate. Heater 300 may further include insulating layer 303 disposed on conducting layer 302. A second conducting layer 304 may be disposed on top of insulating layer 303. In some embodiments, conducting layer 304 may include heater elements arranged in a predetermined pattern. In one embodiment, conducting layer 304 may have heater elements arranged in multiple heating zones that may be individually controlled. For instance, conducting layer may have heater elements arranged to form six independent heating zones with a separate temperature sensor for each zone. In an embodiment, the heater elements may be etched onto conducting layer 304. In other embodiments, the heater layers may be screen printed or bonded to conducting layer 304. FIG. 5 provides an illustration of heater elements and a sample arrangement pattern.

A final insulating layer 305 may be disposed on top of conducting layer 304. Insulating layers 301, 303, and 305 may serve to isolate conducting layers 302 and 304 from each other. In some embodiments, the stacked heater including insulating layers 301, 303, and 305 and conducting layers 302 and 304 may be laminated or lapped to form a singular structure. In some embodiments, conducting layers 302 and 304 may be made from materials including stainless steel, inconel, or aluminum. Insulating layers may include polyimide or high temperature curable ceramic, e.g., Cermabond 865 available from Aremco Inc. In some embodiments, conducting layers 302 and 304 may have a thickness in the range of about 5 µm to about 30 µm. Insulating layers 301, 303, and 305 may have a thickness in the range of about 30 µm to about 60 µm.

Figure 4:
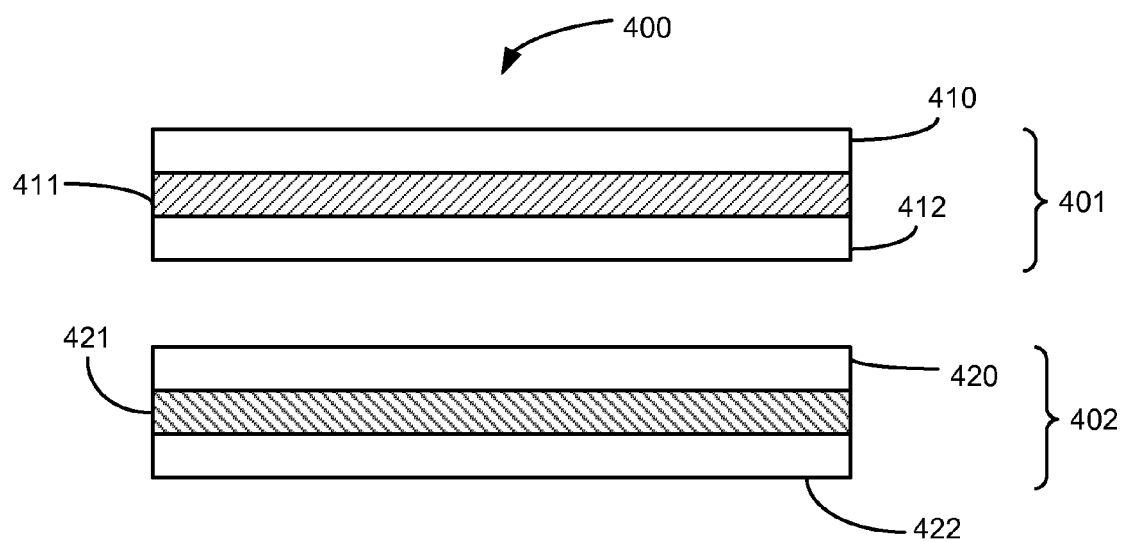
FIG. 4 is a cross-sectional view of a heater element according to another embodiment of the present invention.

FIG. 4 provides an alternate embodiment illustrating heater 400. In this embodiment, heater 400 may include two individual heater stacks. Stack 401 may include an insulating layer 410 disposed on a conducting layer 411. Conducting layer 411 may be disposed on a second insulating layer 412. Conducting layer 411 may include heater elements arranged in multiple independent heating zones pattern similar to conducting layer 304 discussed above. Stack 402 may include insulating layer 420 disposed on conducting layer 421. Conducting layer 421 may be disposed on another insulating layer 422. Conducting layer 421 may have similar characteristic as conducting layer 302 discussed above. In one embodiment, stack 401 and stack 402 may be disposed in region 202 and held together by evacuating region 202 of the substrate processing apparatus, as discussed above. One of the advantages of providing separate heater elements is that it may allow for additional flexibility in maintenance and reconfiguration of the heater elements should the heater fail or in an instance where a different heating profile is desired.

FIG. 5 illustrates a sample heater pattern 500 including heating elements 501. In some embodiments, heater elements 501 range in length from about 1 mm to about 6 mm. The short length of the heater elements may help in reducing warping of the planar members due to differential thermal expansion coefficients and/or any resulting breakage of the heater elements. It is to be noted that the pattern shown in FIG. 5 is for illustration purpose only and one skilled in the art will realize that many other patterns are possible.

Although the invention has been described with respect to specific embodiments, it will be appreciated that the invention is intended to cover all modifications and equivalents within the scope of the following claims.

What is claimed is:
1. A substrate processing apparatus comprising:
a first planar member;
a second planar member disposed below the first planar member;
an evacuated region between the first planar member and the second planar member, the evacuated region being characterized by vacuum;

a heating layer disposed in the evacuated region, wherein the heating layer is coupled to a lower surface of the first planar member and an upper surface of the second planar member; and a first cooling member configured to travel in a vertical direction between a lower surface of the second planar member and an upper surface of a second cooling member, the second cooling member being disposed below the first cooling member, wherein an upper surface of the first cooling member is configured to contact the lower surface of the second planar member at a first position and a lower surface of the first cooling member is configured to contact the upper surface of the second cooling member at a second position.

2. The apparatus of claim 1 wherein the first planar member comprises at least one of aluminum, copper, silicon carbide, aluminum nitride, hexagonal boron nitride, or a copper-tungsten alloy.

3. The apparatus of claim 2 wherein the copper-tungsten alloy comprises about 10% copper and about 90% tungsten.

4. The apparatus of claim 1 wherein the second cooling member is fixed and includes one or more cooling channels adapted to accept a cooling fluid.

5. The apparatus of claim 1 further comprising a plurality of proximity pins disposed on an upper surface of the first planar member.

6. The apparatus of claim 1 wherein the heating layer comprises a plurality of heating elements arranged in one or more independent zones.

* * * * *